(12) United States Patent
  Matsuda

(10) Patent No.: US 10,149,392 B2
(45) Date of Patent: Dec. 4, 2018

(54) MANUFACTURING METHOD OF FLEXIBLE PRINTED WIRING BOARD

(71) Applicant: Nippon Mektron, Ltd., Tokyo (JP)

(72) Inventor: Fumihiko Matsuda, Ryugasaki (JP)

(73) Assignee: NIPPO MEKTRON, LTD., Tokyo (JP)

( * ) Notice: Subject to any disclaimer, the term of this patent is extended or adjusted under 35 U.S.C. 154(b) by 74 days.

(21) Appl. No.: 15/107,931

(22) PCT Filed: Feb. 16, 2015

(86) PCT No.: PCT/JP2015/054099
§ 371 (c)(1),
(2) Date: Jun. 24, 2016

(87) PCT Pub. No.: WO2016/132424
PCT Pub. Date: Aug. 25, 2016

(65) Prior Publication Data
US 2016/0366768 A1  Dec. 15, 2016

(51) Int. Cl.
*H05K 3/02* (2006.01)
*H05K 1/02* (2006.01)
(Continued)

(52) U.S. Cl.
CPC ........... *H05K 3/025* (2013.01); *H05K 1/02* (2013.01); *H05K 1/115* (2013.01); *H05K 3/027* (2013.01);
(Continued)

(58) Field of Classification Search
CPC .......... H05K 1/02; H05K 1/115; H05K 3/025; H05K 3/027; H05K 3/24; H05K 3/40; H05K 3/4053
See application file for complete search history.

(56) References Cited

U.S. PATENT DOCUMENTS 5,336,558 A * 8/1994 Debe ................. C23C 14/12
  257/E31.051
6,992,001 B1 * 1/2006 Lin .................... H01L 24/11
  257/737

(Continued)

FOREIGN PATENT DOCUMENTS

CN   1203430 A   12/1998
CN   1382008 A   11/2002
(Continued)

OTHER PUBLICATIONS

International Search Report, dated Apr. 28, 2015.
(Continued)

*Primary Examiner* — Paul D Kim
(74) *Attorney, Agent, or Firm* — Jacobson Holman, PLLC.

(57) ABSTRACT

The manufacturing method of the flexible printed wiring board relating to an embodiment includes a step of preparing a metal foil clad laminate 1 including an insulating substrate 2 and metal foil 3 and metal foil 4 provided on main surfaces of the substrate 2, a step of forming a circuit pattern 5 by patterning the metal foil 3, a step of forming a peelable printing plate layer 6 on the substrate 2 so as to embed the pattern 5, a step of forming blind holes 7a and 7b where the pattern 5 is exposed inside by partially removing the printing plate layer 6, a step of printing conductive paste with the printing plate layer 6 as a printing mask, and filling the conductive paste 8 inside the blind holes, and a step of peeling off the printing plate layer 6 from the metal foil clad laminate 1.

5 Claims, 8 Drawing Sheets

(51) Int. Cl.
*H05K 3/24* (2006.01)
*H05K 3/40* (2006.01)
*H05K 1/11* (2006.01)

(52) U.S. Cl.
CPC ................ *H05K 3/24* (2013.01); *H05K 3/40* (2013.01); *H05K 3/4053* (2013.01); *H05K 2201/05* (2013.01); *H05K 2201/09509* (2013.01); *H05K 2201/10363* (2013.01)

(56) References Cited

U.S. PATENT DOCUMENTS

| | | | | |
|---|---|---|---|---|
| 7,185,417 | B2* | 3/2007 | Fukuroi | G11B 5/60 |
| | | | | 156/268 |
| 8,634,050 | B2* | 1/2014 | Yamazaki | G02F 1/1341 |
| | | | | 349/190 |
| 8,664,534 | B2* | 3/2014 | Takeuchi | H05K 1/0265 |
| | | | | 174/254 |
| 9,179,545 | B2* | 11/2015 | Kuwabara | B41M 1/10 |
| 2002/0079133 | A1* | 6/2002 | Yamamoto | H05K 3/025 |
| | | | | 174/256 |
| 2005/0155222 | A1* | 7/2005 | Nakamura | H05K 3/0058 |
| | | | | 29/830 |
| 2010/0065194 | A1* | 3/2010 | Nagase | H05K 3/4007 |
| | | | | 156/230 |
| 2013/0062102 | A1 | 3/2013 | Lee et al. | |
| 2014/0332258 | A1 | 11/2014 | Uchida et al. | |
| 2016/0189866 | A1* | 6/2016 | Kitamura | H01G 4/30 |
| | | | | 427/58 |

FOREIGN PATENT DOCUMENTS

| | | |
|---|---|---|
| CN | 1656573 A | 8/2005 |
| JP | 61-176193 A | 8/1986 |
| JP | 2-207591 A | 8/1990 |
| JP | 5-198928 A | 8/1993 |
| JP | 2003-142823 A | 5/2003 |
| JP | 2003-229652 A | 8/2003 |
| JP | 2006-140216 A | 6/2006 |
| JP | 2008-235561 A | 10/2008 |
| JP | 2009-152496 A | 7/2009 |
| JP | 2010-62478 A | 3/2010 |
| JP | 2011-82240 A | 4/2011 |
| JP | 2013-526774 A | 6/2013 |
| JP | 2013-151638 A | 8/2013 |
| JP | 2014-49503 A | 3/2014 |

OTHER PUBLICATIONS

Chinese Office Action, dated Feb. 27, 2018, with English translation (10 pages).
Japanese Office Action, dated Jul. 13, 2018, with English translation.

* cited by examiner

MANUFACTURING METHOD OF FLEXIBLE PRINTED WIRING BOARD

TECHNICAL FIELD

The present invention relates to a manufacturing method of a flexible printed wiring board.

BACKGROUND ART

In recent years, as portable electronic devices such as a smartphone or a digital camera are miniaturized and made highly functional, demands for refinement and density increase are increasing for a flexible printed wiring board used in these electronic devices.

A circuit pattern of a flexible printed wiring board is normally formed by patterning a conductive layer on an insulating substrate by etching using a photofabrication method. Therefore, in order to refine the circuit pattern, it is effective to reduce a thickness of the conductive layer on the insulating substrate. Then, a method of using a copper clad laminate provided with thin copper foil and patterning the copper foil as it is without performing thickening plating to the copper foil is conventionally known. Also, in order to increase a density of the flexible printed wiring board, a method of forming an interlayer connecting path that electrically connects the circuit patterns on both surfaces of the insulating substrate using conductive paste is known. These methods will be described more in detail as follows.

First, as a starting material, the copper clad laminate provided with the thin copper foil on the insulating substrate is prepared. Next, the copper foil is patterned as it is without performing thickening plating processing to the copper foil of the copper clad laminate. Thus, the circuit pattern including wiring, a conformal mask and a land or the like is formed. Next, by laser processing using the conformal mask, a conduction hole that passes through the insulating substrate and has the copper foil exposed at a bottom surface is formed. Then, a screen plate and the circuit pattern are positioned, and the conduction hole is filled with conductive paste by a screen printing method. Thereafter, by thermally curing the conductive paste, the circuit patterns on both surfaces of the insulating substrate are electrically connected.

Additionally, a manufacturing method of a circuit board for a purpose of forming a fine conduction hole is described in Patent Literature 1, and a double-sided printed wiring board having an interlayer connecting path formed of conductive paste filled in a conduction hole is described in Patent Literature 2.

CITATION LIST

Patent Literature

Patent Literature 1: Japanese Patent Laid-Open No. 2003-229652

Patent Literature 2: Japanese Patent Laid-Open No. 2014-49503

SUMMARY OF INVENTION

Technical Problem

In the manufacturing method of a flexible printed wiring board described above, since a copper clad laminate provided with thin copper foil is used and thickening plating is not performed to the copper foil, it is possible to form a fine circuit pattern. However, on the contrary, since a cross sectional area of the circuit pattern is reduced due to reduction of a thickness of the circuit pattern, it is sometimes difficult to secure a required current capacity. For that, it can be considered to increase the thickness of the circuit pattern and secure the required current capacity by printing conductive paste on a required part on the circuit pattern.

However, there is a problem that it becomes difficult to accurately print the conductive paste as the circuit pattern is refined. It is due to the following reason.

As the circuit pattern is refined, a width of wiring becomes narrow and a diameter of a conduction hole for interlayer connection is reduced. Therefore, in order to form conductive paste on the wiring or fill the conductive paste in the conduction hole, it is needed to highly accurately position the circuit pattern and a screen plate when performing screen printing. Conventionally, a high-performance screen printer having an image recognizing function or the like is known. However, for a flexible printed wiring board, an insulating substrate is formed of a flexible material, and some expansion and contraction are unavoidable. Also, the screen plate expands during printing as well. Therefore, even when the high-performance screen printer is used, positioning accuracy increase is limited. Therefore, refinement of the circuit pattern is becoming difficult.

The present invention is implemented in consideration of the above point, and an object thereof is to provide a manufacturing method of a flexible printed wiring board capable of accurately printing conductive paste to a fine circuit pattern and advancing refinement of the circuit pattern.

Solution To Problem

A manufacturing method of a flexible printed wiring board relating to the present invention includes: a step of preparing a metal foil clad laminate including an insulating substrate and metal foil provided on at least one of main surfaces of the insulating substrate; a step of forming a circuit pattern by patterning the metal foil; a step of forming a peelable printing plate layer on the insulating substrate so as to embed the circuit pattern; a step of forming a blind hole where the circuit pattern is exposed inside by partially removing the printing plate layer; a step of printing conductive paste with the printing plate layer as a printing mask, and filling the conductive paste inside the blind hole; and a step of peeling off the printing plate layer from the metal foil clad laminate.

A manufacturing method of a flexible printed wiring board relating to the present invention includes: a step of preparing a metal foil clad laminate including an insulating substrate and metal foil provided on at least one of main surfaces of the insulating substrate; a step of forming a circuit pattern including wiring and a first receiving land and a second receiving land arranged respectively on both sides of the wiring by patterning the metal foil; a step of forming an insulating protective layer so as to embed the circuit pattern; a step of forming a peelable printing plate layer on the insulating protective layer; a step of forming a jumper opening including a first blind hole where the first receiving land is exposed inside, a second blind hole where the second receiving land is exposed inside, and a connecting groove part where the insulating protective layer is exposed at a bottom surface and which connects the first blind hole and the second blind hole; a step of printing conductive paste with the printing plate layer and the insulating protective layer as a printing mask, and filling the conductive paste inside the jumper opening; and a step of peeling off the printing plate layer from the metal foil clad laminate.

Advantageous Effects Of Invention

According to the present invention, conductive paste can be accurately printed to a fine circuit pattern, and refinement of the circuit pattern can be advanced.

BRIEF DESCRIPTION OF DRAWINGS

FIG. 4 consists of FIG. 4A and 4B and FIG. 4A is a plan view for illustrating the manufacturing method of the flexible printed wiring board relating to a second embodiment, and FIG. 4B is a sectional view along an A-A line in FIG. 4A.

FIG. 6A is a plan view for illustrating the manufacturing method of the flexible printed wiring board relating to the second embodiment, following FIG. 5, and FIG. 6B is a sectional view along the A-A line in FIG. 6k FIG. 7 consists of FIG. 7A and FIG. 7B.

FIG. 8A is a plan view for illustrating the manufacturing method of the flexible printed wiring board relating to the second embodiment, following FIG. 7, and FIG. 8B is a sectional view along the A-A line in FIG. 8A.

DESCRIPTION OF EMBODIMENTS

Hereinafter, with reference to the drawings, a manufacturing method of a flexible printed wiring board relating to embodiments of the present invention will be described. Further, same signs are attached to components having equal functions in respective figures, and detailed description of the components of the same sign is not repeated.

(First Embodiment)

The manufacturing method of the flexible printed wiring board relating to the first embodiment of the present invention will be described with reference to FIG. 1 and FIG. 2. The flexible printed wiring board manufactured by the manufacturing method relating to the present embodiment includes an interlayer connecting path formed of conductive paste.

Figure 1:
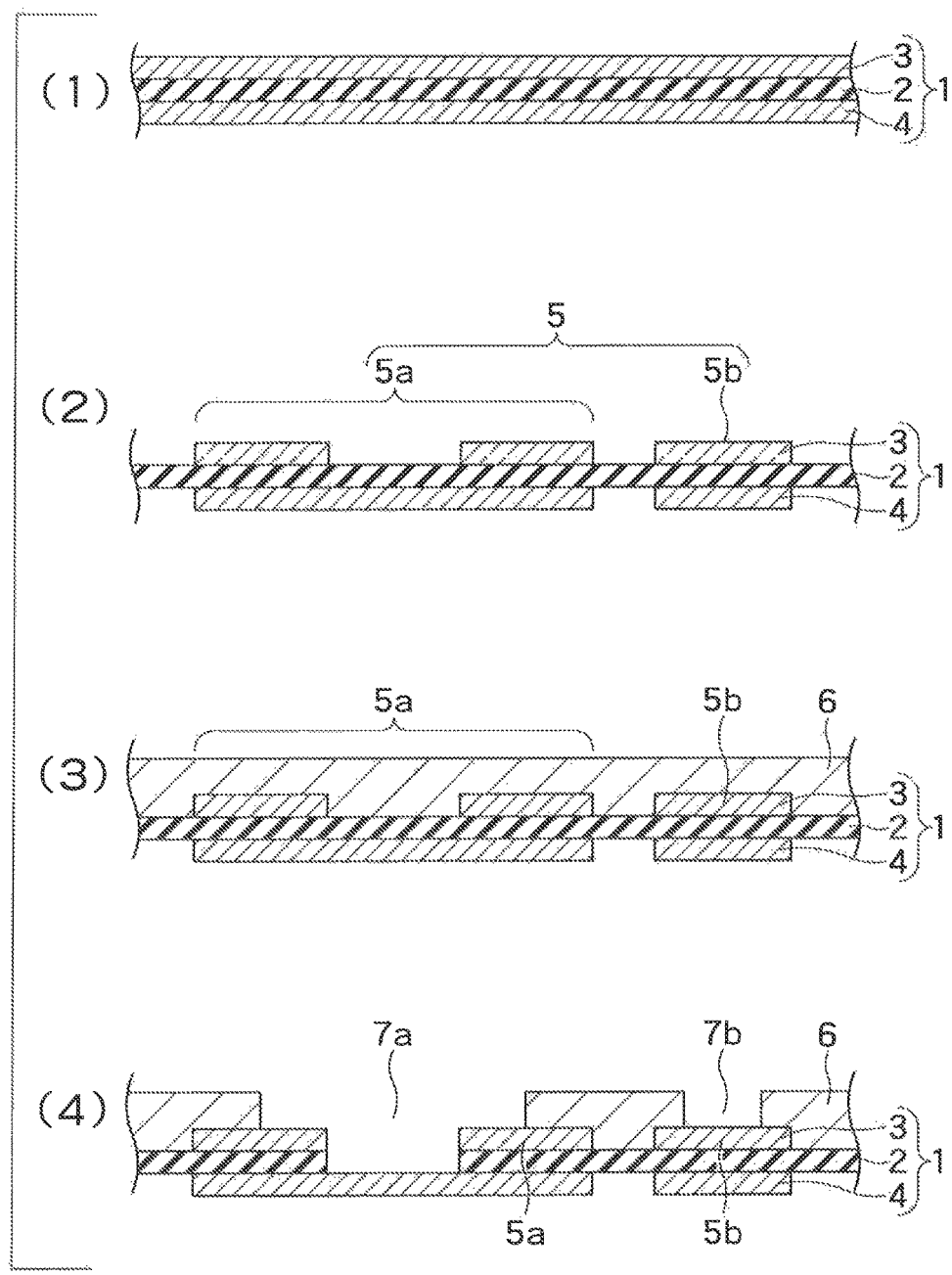
FIG. 1 consists of FIGS. 1.1-1.4 and show a process sectional view for illustrating a manufacturing method of a flexible printed wiring board relating to a first embodiment.

First, as illustrated in FIG. 1.1, a metal foil clad laminate 1 is prepared. The metal foil clad laminate 1 is a double-sided metal foil clad laminate including an insulating substrate 2, and metal foil 3 and metal foil 4 provided respectively on a front surface (upper surface) and a back surface (lower surface) of the insulating substrate 2. The insulating substrate 2 is a flexible insulating film (25 μm thick, for instance) composed of polyimide, polyethylene-terephthalate (PET), a liquid crystal polymer (LCP) or the like, and the metal foil 3 and the metal foil 4 are copper foil (12 μm thick, for example). Further, the metal foil 3 and the metal foil 4 may be constituted of a metal (silver, aluminum or the like) other than copper. Also, for manufacture by a roll-to-roll method, in this process, a roll-like metal foil clad laminate may be prepared as the metal foil clad laminate 1.

Next, as illustrated in FIG. 1.2, a circuit pattern 5 is formed by patterning the metal foil 3 of the metal foil clad laminate 1. Similarly, the metal foil 4 is processed into a predetermined circuit pattern. The metal foil 3 and the metal foil 4 are patterned by etching using a known photofabrication method, for example. In addition, it is preferable to expose etching resist by direct exposure. By this, the need of a photomask is eliminated, and by switching an exposure pattern for each required quantity, the manufacture of many kinds of flexible printed wiring boards in small quantities can be coped with.

The circuit pattern 5 formed in this process includes a conformal mask 5a for forming a conduction hole by laser processing, and wiring 5b extending in a predetermined direction (a direction orthogonal to a paper surface in FIG. 1). Further, the conformal mask 5a may also serve as a land. For example, the conformal mask 5a is in a doughnut shape whose inner diameter is φ150 μm and outer diameter (land diameter) is φ250 μm.

Next, as illustrated in FIG. 1.3, a peelable printing plate layer 6 is formed on the insulating substrate 2 so as to embed the circuit pattern 5. In more detail, the printing plate layer 6 is formed by sticking a film with a slightly adhesive material to the metal foil clad laminate 1 using a laminator device or the like. The film with the slightly adhesive material includes an insulating film and a slightly adhesive material layer provided on the insulating film.

The printing plate layer 6 formed in this process needs to have resistance against heating treatment and chemical treatment in processes described later. As the printing plate layer 6, preferably, a PET film with a slightly adhesive material (for example, SOMATAC CR 1155 manufactured by SOMAR Corporation) is used.

Further, the printing plate layer 6 may be formed by sticking a UV curing type adhesive film that has adhesiveness in an initial state and loses the adhesiveness by being irradiated with UV light to the metal foil clad laminate 1. Also, the printing plate layer 6 may be formed by coating a resin that loses the adhesiveness by heat treatment such as heating on the insulating substrate 2.

Next, as illustrated in FIG. 1.4, the printing plate layer 6 is partially removed and blind holes 7a and 7b where the circuit pattern 5 is exposed inside and which do not pass through the metal foil clad laminate 1 are formed. In more detail, the blind hole 7a is formed by emitting a laser beam to the printing plate layer 6 aiming at the almost center of the conformal mask 5a and partially removing the printing plate layer 6 and the insulating substrate 2. The blind hole 7a is a bottomed step via hole where the metal foil 3 is exposed in the middle and the metal foil 4 is exposed at a bottom surface.

Similarly, the blind hole 7b is formed by emitting the laser beam to the printing plate layer 6 aiming at the wiring 5b and partially removing the printing plate layer 6. At the bottom surface of the blind hole 7b, the wiring 5b is exposed.

In addition, as a laser for forming the blind holes 7a and 7b, a carbon dioxide laser is used for example, however, other lasers may be used.

Also, when irradiating the conformal mask 5a with the laser beam, it is preferable to adjust a beam diameter of the laser beam to be an intermediate value (for example, φ200 μm) of the inner diameter and the outer diameter of the conformal mask 5a by an aperture or the like. By narrowing an alignment area in this way, laser processing position accuracy can be improved, and the diameter of the land can be further reduced. Further, in the case that the beam diameter is φ200 μm, the conformal mask 5a is exposed in the doughnut shape of about 25 μm width inside the blind hole 7a.

Also, formation of the blind holes 7a and 7b is not limited to the laser processing. For example, in the case that the printing plate layer 6 is formed of a photosensitive resin, the blind holes 7a and 7b may be formed by etching the printing plate layer 6 by direct exposure or the like.

After forming the blind holes 7a and 7b, desmear treatment is performed. The desmear treatment is performed by plasma treatment which is dry treatment, permanganic acid treatment which is wet treatment, or the like alone, or a combination thereof.

Figure 2:
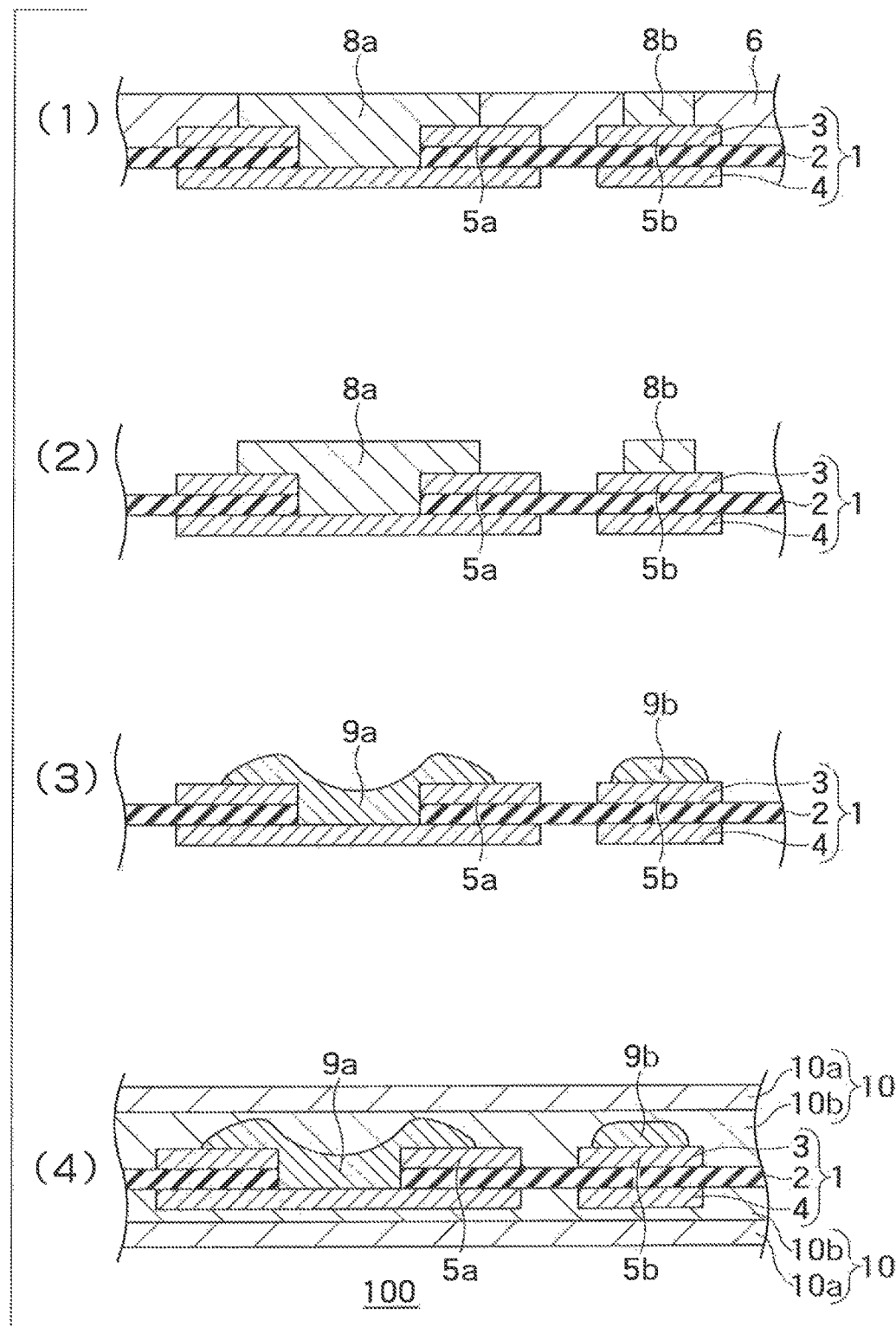
FIG. 2 consists of FIGS. 2.1-2.4 and show a process sectional view for illustrating the manufacturing method of the flexible printed wiring board relating to the first embodiment, following FIG. 1.

Next, as illustrated in FIG. 2.1, conductive paste is printed with the printing plate layer 6 as a printing mask, and conductive pastes 8a and 8b are filled inside the blind holes 7a and 7b. For example, the conductive paste is printed by a squeegee of a screen printer or the like.

By turning the laser-processed printing plate layer 6 to the printing mask in this way, the need of positioning a screen plate and the circuit pattern is eliminated, and the conductive paste can be highly accurately printed on the circuit pattern 5. Also, since a screen printer not having a highly accurate positioning mechanism can be used, a density of the flexible printed wiring board can be increased at a low cost.

Next, as illustrated in FIG. 2.2, the printing plate layer 6 is peeled off from the metal foil clad laminate 1. For example, by a roll-to-roll process, the printing plate layer 6 is continuously peeled off from the metal foil clad laminate 1.

Additionally, in the case that the printing plate layer 6 is formed of the UV curing type adhesive film, after printing the conductive paste, the adhesiveness is extinguished by irradiating the UV curing type adhesive film with the UV light, and the UV curing type adhesive film is peeled off from the metal foil clad laminate 1 thereafter.

Next, as illustrated in FIG. 2.3, the conductive pastes 8a and 8b are thermally cured. The conductive pastes 8a and 8b are cured, and become cured conductive pastes 9a and 9b respectively.

Next, as illustrated in FIG. 2.4, using a vacuum press or a vacuum laminator or the like, a cover lay (insulating protective layer) 10 is formed at a predetermined part of the metal foil clad laminate 1. For the cover lay 10, on an insulating film 10a such as a polyimide film, an adhesive layer 10b formed of an acrylic-based or epoxy-based adhesive is formed. After sticking the cover lay 10 to the metal foil clad laminate 1, surface treatment such as gold plating and outline machining to the circuit pattern 5 are performed as needed.

Through the above-described processes, a flexible printed wiring board 100 illustrated in FIG. 2.4 is obtained. In the flexible printed wiring board 100, the circuit patterns formed on both surfaces of the insulating substrate 2 are electrically connected by the cured conductive paste 9a. Also, a thickness of the wiring 5b is increased by the cured conductive paste 9b. Thus, without thickening a wiring width, a current capacity of the wiring can be increased.

As described above, in the manufacturing method of the flexible printed wiring board relating to the first embodiment, the printing plate layer 6 is formed so as to embed the circuit pattern 5. Then, after forming the blind holes 7a and 7b by partially removing the printing plate layer 6, the conductive paste is printed with the printing plate layer 6 as the printing mask, and the conductive pastes 8a and 8b are filled inside the blind holes 7a and 7b. Therefore, it is not needed to position the circuit pattern 5 and the screen plate in the present embodiment, and the conductive paste can be accurately printed to a fine circuit pattern.

Since the conductive paste can be accurately printed, the refinement of the circuit pattern of the flexible printed wiring board can be advanced. For example, since the conductive paste can be accurately filled in a conduction hole of a small diameter, the diameter of the conformal mask 5a (land) can be reduced. Also, since the conductive paste can be accurately printed and formed on the wiring, the wiring width can be narrowed while securing a required current capacity.

Figure 3:
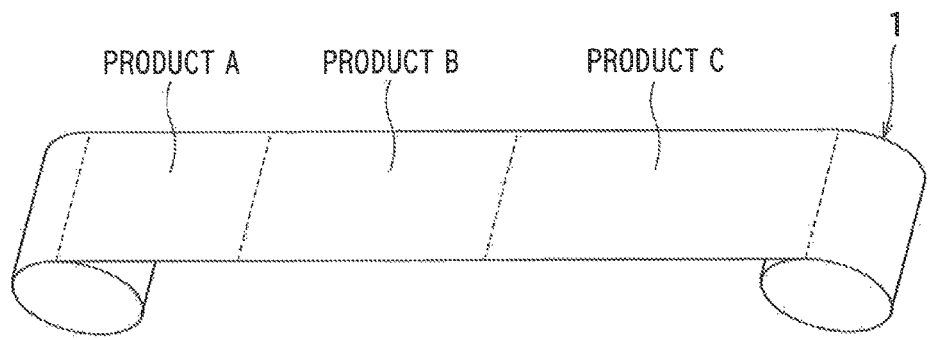
FIG. 3 is a perspective view illustrating manufacture of a plurality of kinds of flexible printed wiring boards by a roll-to-roll method.
Figure 4:
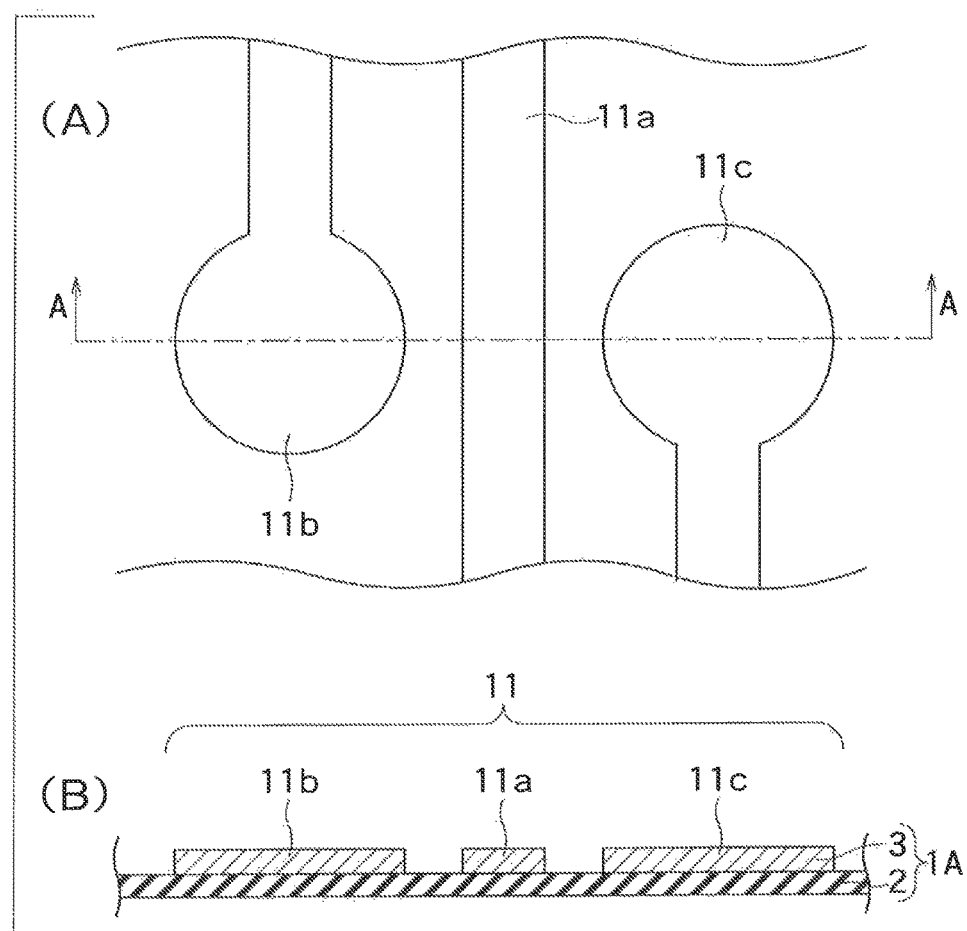

Also, in the manufacturing method of the flexible printed wiring board relating to the present embodiment, since the conductive paste is printed by the printing plate layer 6, there is no need of preparing or exchanging an exclusive screen plate for each product. Therefore, as illustrated in FIG. 3, different products (a product A, a product B, and a product C) can be easily manufactured for each sheet. It is also easy to manufacture different numbers of sheets (manufacture amounts) for the respective products like the product A for five sheets, the product B for three sheets, and the product C for ten sheets or the like. Therefore, according to the present embodiment, many kinds of flexible printed wiring boards in small quantities can be stably manufactured with high productivity.

Further, since the need of arranging and exchanging work or the like of the screen plate is eliminated, according to the first embodiment, by preparing a roll-like metal foil clad laminate 1 in the process of preparing the metal foil clad laminate 1, the processes from the process of forming the circuit pattern 5 to the process of thermally curing the conductive pastes 8a and 8b can be performed by the roll-to-roll method.

In the case that sheet lengths of the individual products are the same, the roll-to-roll method is possible up to the process of forming the cover lay 10. Even in the case that the sheet lengths of the individual products are different, since there is no need of using an exclusive tool (an exposure mask or a printing plate or the like) for each product, the roll-to-roll process is possible to the process before the process of forming the cover lay 10. In the case of using a photosensitive cover instead of the cover lay, even when the sheet lengths of the individual products are different, the roll-to-roll method is possible to the process of forming the cover.

As described above, the processes from the process of forming the circuit pattern 5 to the process of forming the cover lay 10 may be performed by the roll-to-roll method. Further, it is preferable to perform the processes from the process of forming the circuit pattern 5 to at least the process of printing the conductive paste by the roll-to-roll method. By continuously making the process flow by the roll-to-roll method, manufacturing efficiency of the flexible printed wiring board can be substantially improved.

In addition, in the description of the first embodiment, the double-sided metal foil clad laminate is used as the metal foil clad laminate 1, however, it is possible to apply the manufacturing method of the present embodiment even to a single-sided metal foil clad laminate. For example, the conductive paste may be formed by printing using the printing plate layer on the circuit pattern formed by patterning the metal foil of the single-sided metal foil clad laminate.

(Second Embodiment)

Next, the manufacturing method of the flexible printed wiring board relating to the second embodiment of the present invention will be described with reference to FIG. 4 to FIG. 8. The flexible printed wiring board manufactured by the manufacturing method relating to the present embodiment includes a jumper connecting path formed of the conductive paste.

First, as a starting material, a metal foil clad laminate 1A is prepared. The metal foil clad laminate 1A is a single-sided metal foil clad laminate including the insulating substrate 2 and the metal foil 3 provided on the front surface (upper surface) of the insulating substrate 2. Further, the metal foil clad laminate 1A may be a double-sided metal foil clad laminate.

Next, as illustrated in FIG. 4A and FIG. 4B, a circuit pattern 11 is formed by patterning the metal foil 3. In addition, the metal foil 3 is patterned by etching using the known photofabrication method, for example.

The circuit pattern 11 formed in this process includes wiring 11a that extends in a predetermined direction, a receiving land 11b and a receiving land 11c. The receiving land 11b and the receiving land 11c are arranged respectively on both sides of the wiring 11a so as hold the wiring 11a therebetween. In more detail, wiring is connected respectively to the receiving land 11b and the receiving land 11c in a circular shape, and the wiring 11a is arranged so as to pass through between a pattern having the receiving land 11b at an end and a pattern having the receiving land 11c at an end.

Figure 5:
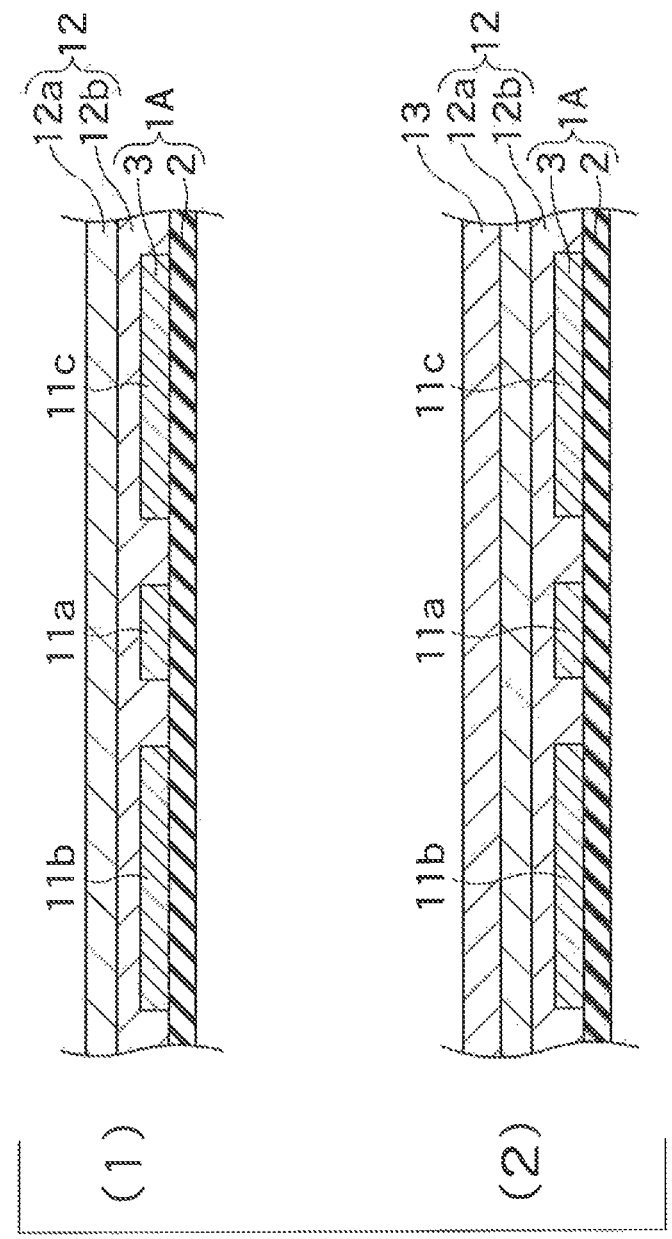
FIG. 5 consists of FIGS. 5.1 and 5.2 and show a process sectional view for illustrating the manufacturing method of the flexible printed wiring board relating to the second embodiment, following FIG. 4.
Figure 6:
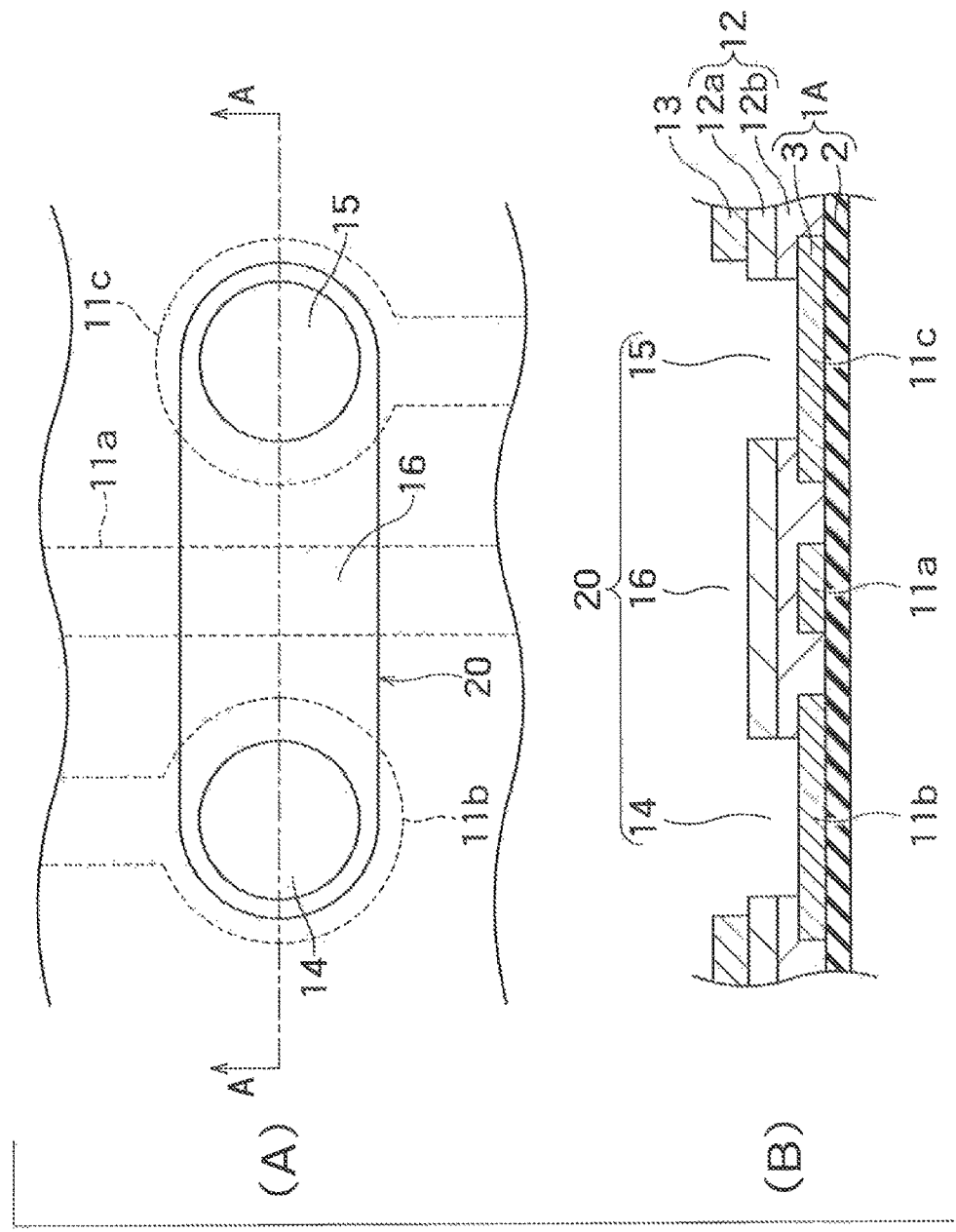
FIG. 6 consists of FIG. 6A and FIG. 6B.
Figure 7:
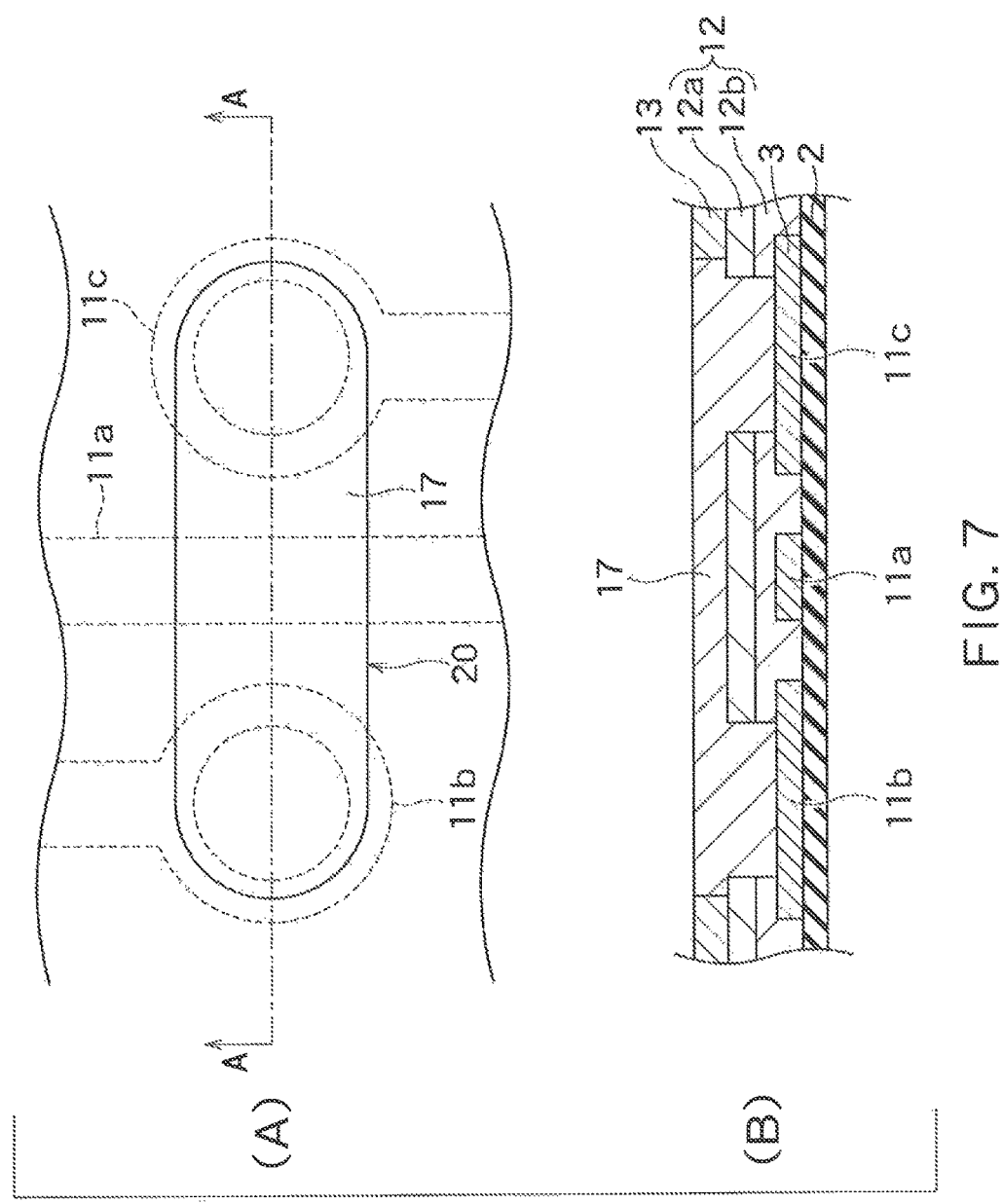
FIG. 7A is a plan view for illustrating the manufacturing method of the flexible printed wiring board relating to the second embodiment, following FIG. 6.
FIG. 7B is a sectional view along the A-A line in FIG. 7A.
Figure 8:
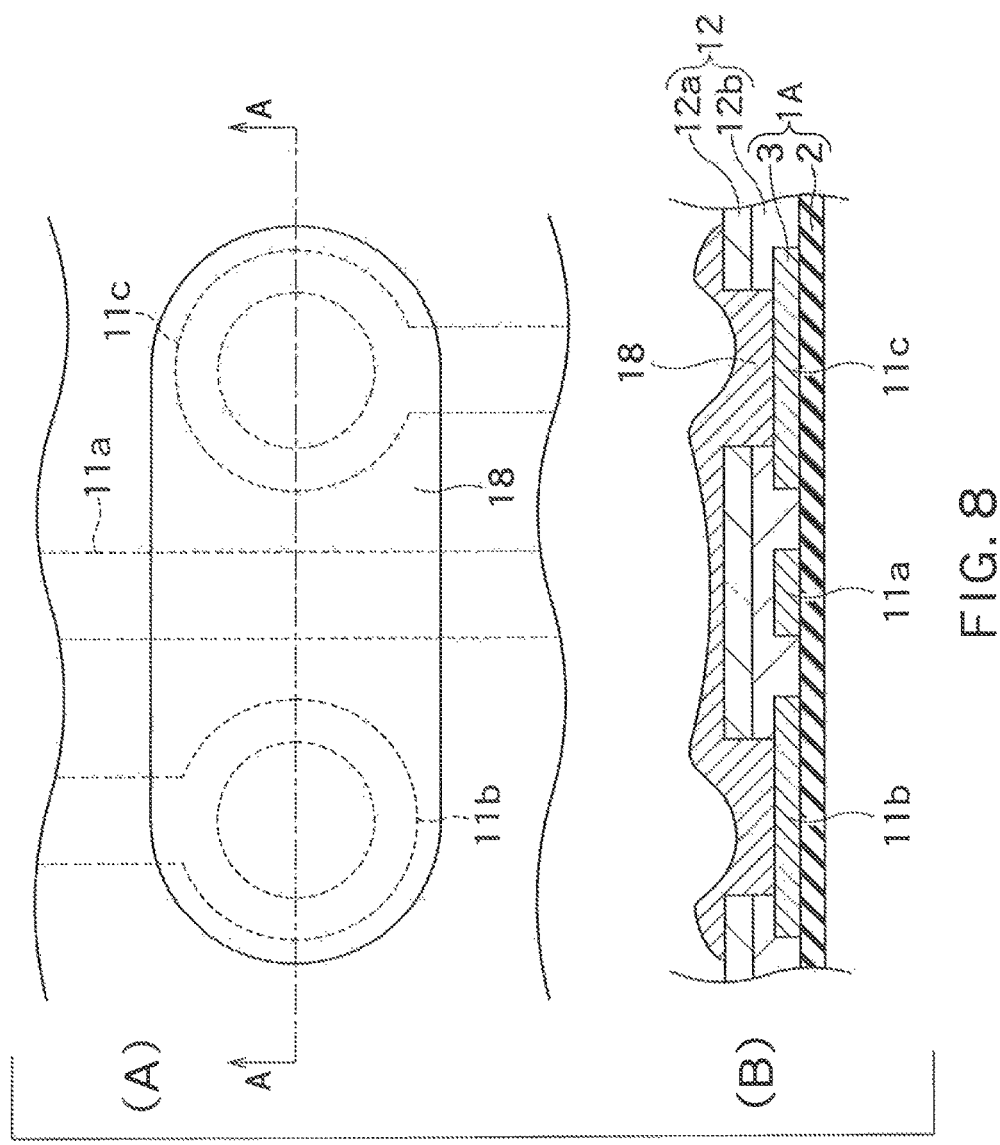
FIG. 8 consists of FIG. 8A and FIG. 8B.

Next, as illustrated in FIG. 5.1, a cover lay (insulating protective layer) 12 is formed so as to embed the circuit pattern 11 at a predetermined part of the metal foil clad laminate 1A. For the cover lay 12, similarly to the cover lay 10 described in the first embodiment, an adhesive layer 12b is formed on an insulating film 12a.

Then, as illustrated in FIG. 5.2, a peelable printing plate layer 13 is formed on the cover lay 12. Since the printing plate layer 13 is similar to the printing plate layer 6 described in the first embodiment, detailed description will be omitted.

Next, as illustrated in FIG. 6A and FIG. 6B, a jumper opening 20 including a blind hole 14 where the receiving land 11b is exposed inside, a blind hole 15 where the receiving land 11c is exposed inside, and a connecting groove part 16 where the cover lay 12 is exposed at a bottom surface and which connects the blind hole 14 and the blind hole 15 is formed. In more detail, first, the printing plate layer 13 and the cover lay 12 are partially removed and the blind hole 14 and the blind hole 15 are formed. The receiving land 11b is exposed at the bottom surface for the blind hole 14, and the receiving land 11c is exposed at the bottom surface for the blind hole 15. For example, the blind hole 14 (15) is formed by emitting a laser beam to the printing plate layer 13 aiming at the almost center of the receiving land 11b (11c) and partially removing the printing plate layer 13 and the cover lay 12.

After forming the blind holes 14 and 15, the printing plate layer 13 is partially removed, and the connecting groove part 16 is formed. The connecting groove part 16 has the cover lay 12 (insulating film 12a) exposed at the bottom surface, and connects the blind hole 14 and the blind hole 15.

The connecting groove part 16 is formed by irradiating the printing plate layer 13 between the blind hole 14 and the blind hole 15 with the laser beam and partially removing the printing plate layer 13, for example. At the time, output of a laser device (a carbon dioxide laser, for example) is adjusted so as to remove only the printing plate layer 13, and the laser beam is emitted to the printing plate layer 13 while being linearly scanned. Further, in order to improve selective processability of the printing plate layer 13 and the cover lay 12, a UV-YAG laser of a short wavelength, an excimer laser, or the like may be used.

By forming the blind holes 14 and 15 and the connecting groove part 16 as described above, the jumper opening 20 is formed. After forming the jumper opening 20, the desmear treatment is performed.

In addition, in the process of forming the jumper opening 20, a forming order of the blind hole 14, the blind hole 15 and the connecting groove part 16 is arbitrary. For example, the blind holes 14 and 15 may be formed after forming the connecting groove part 16, or they may be formed in the order of the blind hole 14, the connecting groove part 16 and the blind hole 15.

Next, as illustrated in FIG. 7A and FIG. 7B, the conductive paste is printed with the printing plate layer 13 and the cover lay 12 as the printing mask, and conductive paste 17 is filled inside the jumper opening 20. Thus, the conductive paste 17 is filled inside the blind holes 14 and 15 and the connecting groove part 16. Printing in this process is performed using a squeegee of a screen printer or the like, for example.

In this way, in the second embodiment, by turning the laser-processed printing plate layer 13 and cover lay 12 to the printing mask, the conductive paste can be highly accurately printed on the circuit pattern 11. Also, the need of an exclusive screen plate is eliminated, and the need of positioning between the screen plate and the circuit pattern 11 is also eliminated.

Next, the printing plate layer 13 is peeled off from the metal foil clad laminate 1A (cover lay 12). For example, by the roll-to-roll process, the printing plate layer 13 is continuously peeled off from the metal foil clad laminate 1A.

Then, as illustrated in FIG. 8A and FIG. 8B, the conductive paste 17 printed in accordance with a shape of the jumper opening 20 is thermally cured, and turned to cured conductive paste 18 that functions as a jumper wire.

Thereafter, for insulation property reservation and physical protection of the cured conductive paste 18, the jumper wire is coated with various kinds of resist, cover lay or overcoat materials or the like, as needed.

Through the processes described above, the flexible printed wiring board having a configuration that the receiving land 11b and the receiving land 11c are electrically connected by the jumper wire formed of the cured conductive paste 18 is obtained.

Further, for the second embodiment as well, similarly to the first embodiment, the individual processes can be performed by the roll-to-roll process.

Also, in the above description, the number of the receiving lands is two, however, it is not limited thereto. Three or more receiving lands may be formed and the jumper wire that electrically connects the receiving lands may be formed.

Also, a planar shape of the jumper wire is not limited to a straight line shape, and can be an arbitrary shape such as a curve.

Also, in the description of the second embodiment, the single-sided metal foil clad laminate is used as the metal foil clad laminate 1A, however, as illustrated in the following modification, the manufacturing method of the second embodiment is applicable to the double-sided metal foil clad laminated as well.

<Modification of second embodiment>

Figure 9:
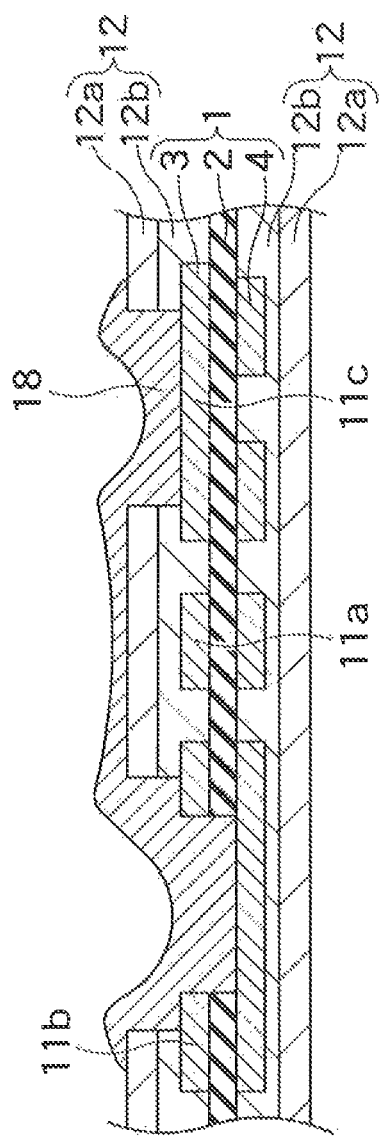
FIG. 9 is a sectional view of the flexible printed wiring board relating to a modification of the second embodiment.

In this modification, as illustrated in FIG. 9, as a starting material, the metal foil clad laminate 1 which is the double-sided metal foil clad laminate is used. Then, similarly to the first embodiment, the metal foil 3 is patterned, and the circuit pattern including the wiring 11a, the receiving land 11b and the receiving land 11c is formed. Here, the receiving land 11b is formed into the doughnut shape for example, and turned to a conformal mask. Further, the receiving land 11c may be also turned to the conformal mask.

Next, in the process of forming the blind hole 14 described above, a bottomed step via hole where the metal foil 3 is exposed in the middle and the metal foil 4 is exposed at the bottom surface is formed. Thereafter, similarly to the processes described above, the conductive paste is filled in the jumper opening, the printing plate layer is peeled off, and the filled conductive paste is cured and turned to the cured conductive paste 18. The cured conductive paste 18 formed in this way, as illustrated in FIG. 9, functions as the jumper wire, and also functions as an interlayer connecting path that electrically connects the circuit patterns formed on both surfaces of the insulating substrate 2.

On the basis of the above description, those skilled in the art may conceive additional effects and various modifications of the present invention. However, aspects of the present invention are not limited to the embodiments described above. Various additions, modifications and partial deletion are possible without departing from the conceptual spirit and meaning of the present invention derived from contents defined in the scope of claims and the equivalency thereof.

REFERENCE SIGNS LIST 1, 1A metal foil clad laminate
2 insulating substrate
3, 4 metal foil
5 circuit pattern
5a conformal mask
5b wiring
6 printing plate layer
7a, 7b blind hole
8a, 8b conductive paste (before being cured)
9a, 9b cured conductive paste
10 cover lay (insulating protective layer)
10a insulating film
10b adhesive layer
11 circuit pattern
11a wiring
11b, 11c receiving land
12 cover lay (insulating protective layer)
12a insulating film
12b adhesive layer
13 printing plate layer
14, 15 blind hole
16 connecting groove part
17 conductive paste (before being cured)
18 cured conductive paste
20 jumper opening
100 flexible printed wiring board

The invention claimed is:

1. A manufacturing method of a flexible printed wiring board comprising:
    a step of preparing a metal foil clad laminate including an insulating substrate and metal foil provided on at least one of main surfaces of the insulating substrate;
    a step of forming a circuit pattern by patterning the metal foil;
    a step of forming a peelable printing plate layer on the insulating substrate so as to embed the circuit pattern;
    a step of forming a blind hole where the circuit pattern is exposed inside by partially removing the printing plate layer;
    a step of printing conductive paste with the printing plate layer as a printing mask, and filling the conductive paste inside the blind hole; and
    a step of peeling off the printing plate layer from the metal foil clad laminate;
    wherein the metal foil clad laminate is a double-sided metal foil clad laminate provided with first metal foil and second metal foil respectively on a front surface and a back surface of the insulating substrate, and the circuit pattern includes a conformal mask, and
    wherein, in the step of forming the blind hole, by irradiating the printing plate layer with a laser beam and partially removing the printing plate layer and the insulating substrate, a bottomed step via hole where the first metal foil is exposed in the middle and the second metal foil is exposed at a bottom surface is formed as the blind hole.

2. The manufacturing method of the flexible printed wiring board according to claim 1,
    wherein the printing plate layer is formed by sticking a film with a slightly adhesive material to the metal foil clad laminate.

3. The manufacturing method of the flexible printed wiring board according to claim 1,
    wherein the printing plate layer is formed by sticking a UV curing type adhesive film to the metal foil clad laminate, adhesiveness is extinguished by irradiating the UV curing type adhesive film with UV light after the conductive paste is printed, and the UV curing type adhesive film is peeled off from the metal foil clad laminate.

4. The manufacturing method of the flexible printed wiring board according to claim 1,
    wherein, in the step of preparing the metal foil clad laminate, a roll metal foil clad laminate is prepared as the metal foil clad laminate, and the steps from the step of forming the circuit pattern to at least the step of printing the conductive paste are carried out by a roll-to-roll method.

5. The manufacturing method of the flexible printed wiring board according to claim 4, further comprising
    a step of thermally curing the conductive paste and forming an insulating protective layer at a predetermined part of the metal foil clad laminate,
    wherein the steps from the step of forming the circuit pattern to the step of forming the insulating protective layer are carried out by the roll-to-roll method.

* * * * *

UNITED STATES PATENT AND TRADEMARK OFFICE
CERTIFICATE OF CORRECTION

PATENT NO. : 10,149,392 B2
APPLICATION NO. : 15/107931
DATED : December 4, 2018
INVENTOR(S) : Fumihiko Matsuda Page 1 of 1

It is certified that error appears in the above-identified patent and that said Letters Patent is hereby corrected as shown below:

On the Title Page

Please correct item (73) Assignee's name from "NIPPO MEKTRON, LTD." to --NIPPON MEKTRON, LTD.--.

Signed and Sealed this
Thirteenth Day of August, 2019

Andrei Iancu
*Director of the United States Patent and Trademark Office*